US008937757B2

(12) United States Patent
Yasuda (10) Patent No.: US 8,937,757 B2
(45) Date of Patent: Jan. 20, 2015

(54) OPTICAL DEFLECTOR APPARATUS INCLUDING OPTICAL DEFLECTOR CHIP SANDWICHED BY TWO SUBSTRATES

(75) Inventor: Yoshiaki Yasuda, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 331 days.

(21) Appl. No.: 13/610,119

(22) Filed: Sep. 11, 2012

(65) Prior Publication Data

US 2013/0083381 A1  Apr. 4, 2013

(30) Foreign Application Priority Data

Sep. 29, 2011  (JP) .................................. 2011-215621

(51) Int. Cl.
*G02B 26/08*  (2006.01)
*B81B 7/00*  (2006.01)

(52) U.S. Cl.
CPC .......... *G02B 26/0833* (2013.01); *B81B 7/0067* (2013.01); *B81B 2207/095* (2013.01)
USPC .................. 359/224.1; 359/199.2; 359/199.4; 359/290; 359/298; 359/199.1

(58) Field of Classification Search
CPC ........... B81B 2207/095; B81B 7/0067; G02B 26/0833; G02B 26/0841; G02B 26/0858; G02B 6/3518; G02B 6/3546; G02B 6/357; G02B 6/3584
USPC .......... 359/198.1–199.2, 199.4, 200.6, 200.8, 359/224.1–224.2, 290, 291, 298; 257/E23.011, E21.511; 438/118
See application file for complete search history.

(56) References Cited

U.S. PATENT DOCUMENTS

| 6,906,849 | B1 | 6/2005 | Mi et al. |
| 7,474,005 | B2 * | 1/2009 | Aksyuk et al. ................ 257/777 |
| 2003/0048979 | A1 | 3/2003 | Beerling et al. |
| 2011/0292479 | A1 | 12/2011 | Hiraoka et al. |

FOREIGN PATENT DOCUMENTS

| JP | 2005-019966 A | 1/2005 |
| JP | 2008-020701 A | 1/2008 |
| JP | 2009-223165 A | 10/2009 |
| JP | 2010-122480 A | 6/2010 |

OTHER PUBLICATIONS

Partial European Search Report (PESR) dated Jan. 8, 2013 (in English) issued in counterpart European Application No. 12006417.5.

* cited by examiner

*Primary Examiner* — James Phan
(74) *Attorney, Agent, or Firm* — Holtz, Holtz, Goodman & Chick PC (57) ABSTRACT

In an optical deflector apparatus, an optical deflector chip includes a mirror, an actuator adapted to rock the mirror, and first pads on a front surface of the optical deflector chip and connected to the actuator. A first substrate includes second pads on a back surface of the first substrate, and an opening is formed in the first substrate. The front surface of the optical deflector chip is adhered to the back surface of the first substrate in such a way that the first pads of the optical deflector chip are in contact with respective ones of the second pads of the first substrate and the mirror opposes the opening. A back surface of said optical deflector chip is adhered to a front surface of a second substrate.

16 Claims, 9 Drawing Sheets

OPTICAL DEFLECTOR APPARATUS INCLUDING OPTICAL DEFLECTOR CHIP SANDWHICHED BY TWO SUBSTRATES

This application claims the priority benefit under 35 U.S.C. §119 to Japanese Patent Application No. JP2011-215621 filed on Sep. 29, 2011, which disclosure is hereby incorporated in its entirety by reference.

BACKGROUND

1. Field

The presently disclosed subject matter relates to an optical deflector apparatus which can be applied to a projection-type display system, for example.

2. Description of the Related Art

Recently, in a projection-type display system, a spotlight from a light source is deflected by an optical deflector apparatus and then, is projected onto a screen. The optical deflector apparatus includes a two-dimensional optical deflector which is a micro electro mechanical system (MEMS) device manufactured by using semiconductor manufacturing processes and micro machine technology, and a package for protecting the two-dimensional optical deflector.

Generally, a two-dimensional optical deflector includes a mirror for reflecting a spotlight from a light source, a movable frame surrounding the mirror for supporting the mirror, an inner actuator for vibrating (rocking) the mirror with respect to an X-axis of the mirror, a support body surrounding the movable frame, and an outer actuator for rocking the mirror through the movable frame with respect to a Y-axis of the mirror perpendicular to the X-axis.

As a first example, the inner actuator is constructed by torsion-bar type piezoelectric actuators for rocking the mirror through torsion bars, and the outer actuator is constructed by other torsion-bar type piezoelectric actuators for rocking the movable frame through other torsion bars (see: JP2008-20701A). Also, as a second example, the inner actuator is constructed by torsion-bar type piezoelectric actuators for rocking the mirror through torsion bars, and the outer actuator is constructed by meander type piezoelectric actuators for rocking the movable frame (see: JP2009-223165A). Further, as a third example, the inner actuator is constructed by meander type piezoelectric actuators for rocking the mirror, and the outer actuator is constructed by other meander type piezoelectric actuators for rocking the movable frame (see: JP2010-122480A & US2011/0292479A1).

The optical deflector apparatus has an advantage in that the structure is small and simple, and the drive power is not so large. In order to effectively exhibit this advantage, the package is preferably as small as possible.

In a first prior art optical deflector apparatus, an optical deflector is die-bonded by using resin to form a ceramic package, and then, a wire-bonding operation is performed between electrode pads of the optical deflector and electrode pads of the ceramic package.

In the above-described first prior art optical deflector apparatus, however, since spacing for bonding wires is required in the ceramic package, the ceramic package would be larger in size than the two-dimensional optical deflector. Also, since the ceramic package is sintered, the size in step and the width in periphery of the ceramic package cannot be reduced. Thus, the entire optical deflector apparatus would be large in size. Note that, if the optical deflector per se is reduced in size, it may be possible to reduce the entire optical deflector apparatus. In this case, however, the optical deflector needs to be redesigned to increase the developing period.

In a second prior art optical deflector apparatus, a wireless wafer-level package technology is adopted (see: JP2005-19966A). That is, a silicon wafer on which a plurality of MEMS chips corresponding to optical deflectors are arranged is adhered to a cap wafer on which sealing caps are arranged. Then, through silicon vias (TSVs) are formed within the silicon wafer to electrically connect the MEMS chips to electrodes on the external surface of the silicon wafer. Finally, the silicon wafer and the cap wafer are diced along scribing lines thereof by using dicing blades or the like to separate one of the MEMS chips associated with one of the sealing caps from each other. Thus, the size of each of the diced sealing caps is the same as that of the diced MEMS chips, so that the optical deflector apparatus would be reduced in size.

In the above-described second prior art optical deflector apparatus, however, since the TSVs need to be formed within the silicon wafer, the manufacturing yield would be reduced, so that the manufacturing cost would be increased.

Also, even if the silicon wafer includes defective MEMS chips, such defective MEMS chips would be assembled by sealing caps, which also would increase the manufacturing cost.

Further, when the silicon wafer is diced by a dicing process using dicing blades, very small defects, i.e., so-called tipping would be generated in the MEMS chips of the silicon wafer, so that the manufacturing yield would be reduced, which further would increase the manufacturing cost.

SUMMARY

The presently disclosed subject matter seeks to solve one or more of the above-described problems.

According to the presently disclosed subject matter, in an optical deflector apparatus, an optical deflector chip includes a mirror, an actuator adapted to rock the mirror, and first pads on a front surface of the optical deflector chip and connected to the actuator. A first substrate includes second pads on a back surface of the first substrate, and an opening is formed in the first substrate. The front surface of the optical deflector chip is adhered to the back surface of the first substrate in such a way that the first pads of the optical deflector chip are in contact with respective ones of the second pads of the first substrate and the mirror opposes the opening. A back surface of the optical deflector chip is adhered to a front surface of a second substrate.

Also, the first substrate comprises organic material such as glass epoxy resin. In this case, the first substrate further includes: third pads on a front surface of the first substrate; via-structures in the first substrate connected between the first pads and the third pads; and electrode terminals on the front surface of the first substrate and being connected to respective ones of the third pads.

Further, the first substrate comprises ceramic. In this case, the first substrate further includes: electrode terminals on a front surface of the first substrate; and interconnections in the first substrate connected between the second pads and respective ones of the electrode terminals.

The optical deflector chip further includes: a first frame-shaped sealing electrode pattern on the front surface of the optical deflector chip; and a second frame-shaped sealing electrode pattern on the back surface of the optical deflector chip. The first substrate further includes a third frame-shaped electrode pattern on the back surface of the first substrate in contact with the first frame-shaped electrode pattern of the optical deflector chip. The second substrate further includes a fourth frame-shaped electrode pattern on the front surface of the second substrate in contact with the second frame-shaped electrode pattern of the optical deflector chip. The optical deflector apparatus further comprises a sealing transparent glass plate adhered to the front surface of the first substrate. In the optical deflector apparatus, inert gas is introduced to replace the air with it, or the inside air is evacuated. Also, anti-reflection layers are formed on both surfaces of the sealing transparent glass plate. Each of the anti-reflection layers is configured to reflect a red light component, a green light component and a blue light component.

The second substrate comprises metal such as aluminum.

According to the presently disclosed subject matter, since the sizes of the first and second substrates in the traverse direction are substantially the same as the optical deflector chip, the optical deflector apparatus can be reduced in size. Also, since it doesn't need to build TSVs in the optical deflector chip, and via-electrodes of interconnections between in front and back surface pads are inexpensive, the manufacturing cost can be reduced.

BRIEF DESCRIPTION OF THE DRAWINGS

The above and other advantages and features of the presently disclosed subject matter will be more apparent from the following description of certain embodiments, taken in conjunction with the accompanying drawings, wherein.

DETAILED DESCRIPTION OF EXEMPLARY EMBODIMENTS

Figure 1:
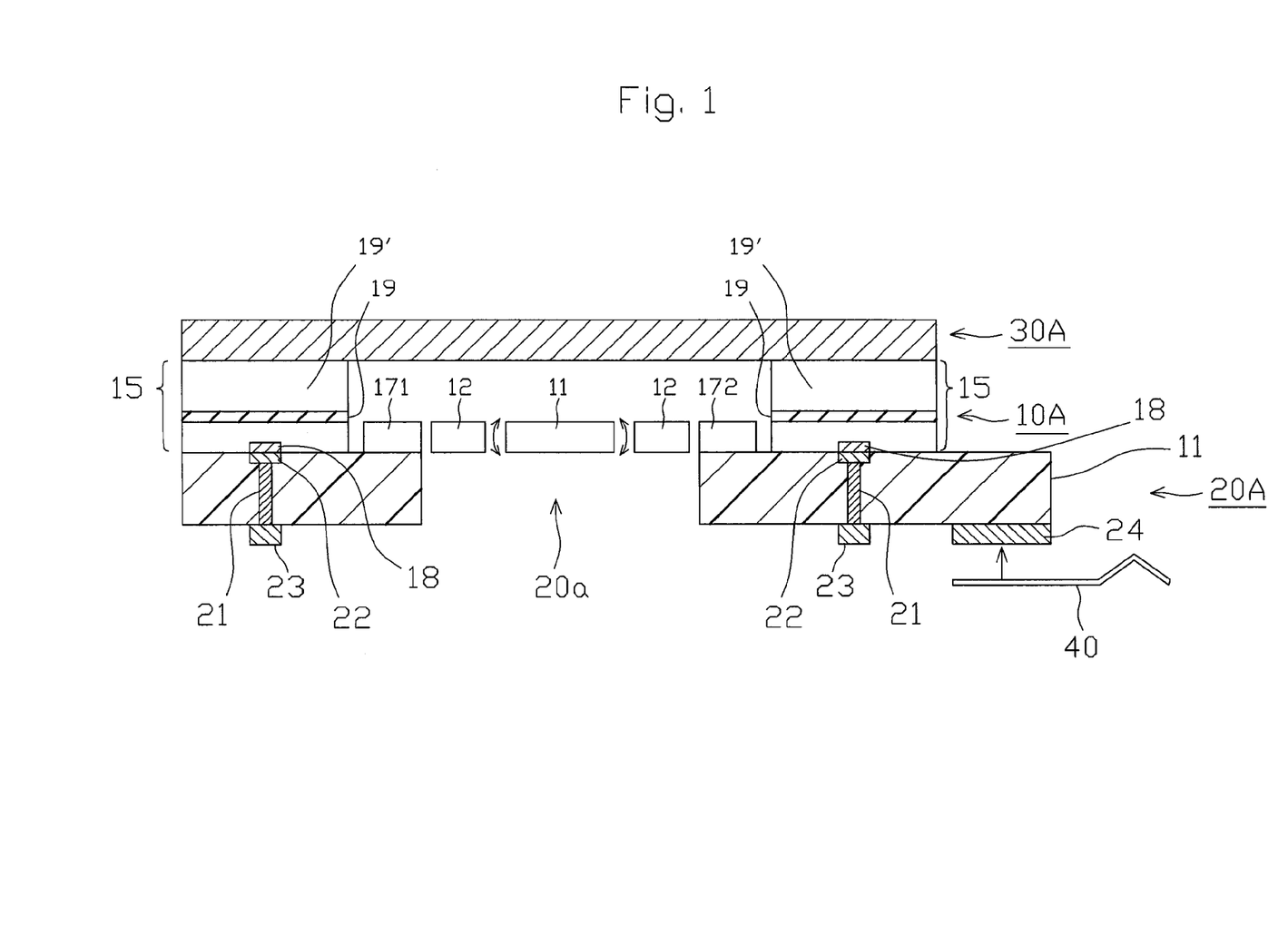
FIG. 1 is a cross-sectional view illustrating a first embodiment of the optical deflector apparatus according to the presently disclosed subject matter.

In FIG. 1, which is a cross-sectional view illustrating a first embodiment of the optical deflector apparatus according to the presently disclosed subject matter, a front surface of an optical deflector chip 10A is adhered by a so-called flip-chip bonding process to a back surface of a double-side printed circuit board 20A as a first substrate made of organic material such as glass epoxy resin so-called FR4, while a back surface of the optical deflector chip 10A is adhered to a front surface of a metal substrate such as an aluminum substrate 30A as a second substrate with no circuit. Note that the optical deflector apparatus of FIG. 1 is of an open type.

Figure 2A:
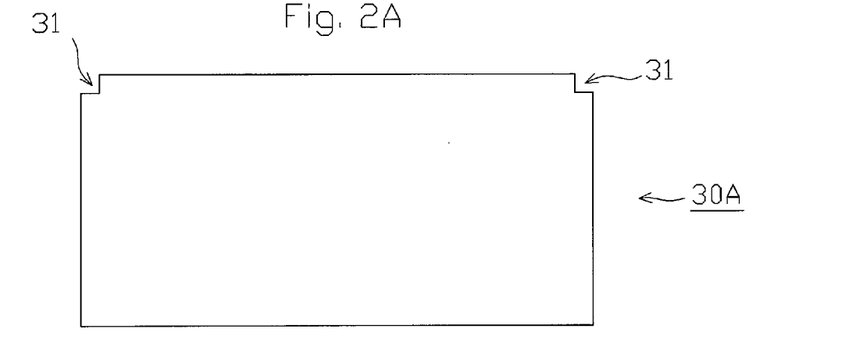
FIG. 2A is a front view of the aluminum substrate of FIG. 1.
Figure 2B:
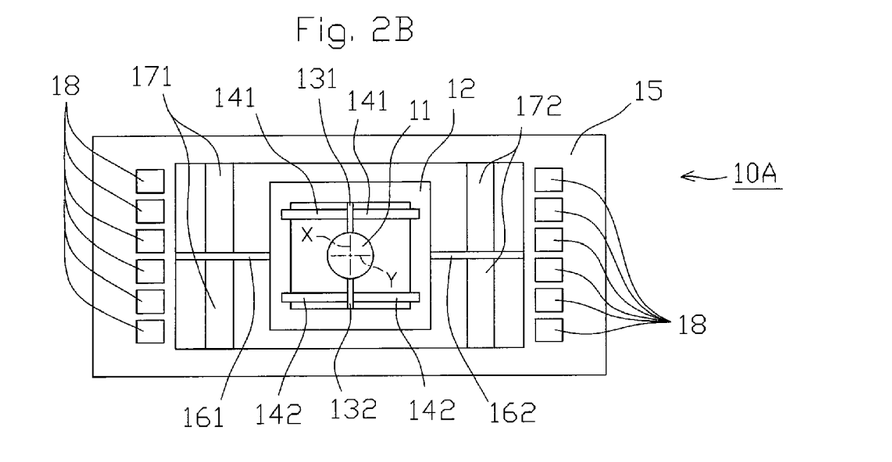
FIG. 2B is a front view of the optical deflector chip of FIG. 1.

In FIG. 2B, which is a front view of the optical deflector chip 10A of FIG. 1, the optical deflector chip 10A is constructed by a circular mirror 11, a movable frame 12 surrounding the mirror 11 for supporting the mirror 11 through a pair of torsion bars 131 and 132, two pairs of inner piezoelectric actuators 141 and 142 of a torsion-bar type fixed between the movable frame 12 and the torsion bars 131 and 132 and serving as cantilevers for rocking the mirror 11 through the torsion bars 131 and 132 with respect to an X-axis of the mirror 11, a support body 15 surrounding the movable frame 12 for supporting the movable frame 12 through a pair of torsion bars 161 and 162, and two pairs of outer piezoelectric actuators 171 and 172 of a torsion-bar type fixed between the support body 15 and the torsion bars 161 and 162 and serving as cantilevers for rocking the mirror 11 through the torsion bars 161 and 162 and the movable frame 12 with respect to a Y-axis of the mirror 11 perpendicular to the X-axis.

Provided on the front surface of the support body 15 are pads 18 made of plated Au or Cu which are connected to upper electrode layers and lower electrode layers (not shown) of the inner piezoelectric actuators 141 and 142 and the outer piezoelectric actuators 171 and 172.

Also, the support body 15 is of a rib structure which is thicker than the other portions of the optical deflector chip 10A to thereby enhance the rigidity thereof. Note that a silicon dioxide layer 19 and a silicon substrate 19' in the support body 15 of FIG. 1 is a Box layer and a Handle layer, respectively, of a silicon-on-insulator (SOI) wafer which is used for manufacturing the optical deflector chip 10A.

Returning to FIG. 1, the double-side printed circuit board 20A has an opening 20a opposing the mirror 11 of the optical deflector chip 10A, so that incident light from a light source (not shown) can reach the mirror 11 through the opening 20a and light reflected from the mirror 11 can emit through the opening 20a. Also, plated via-structures 21 with pads 22 and 23, and electrode terminals 24 are provided in the double-side printed circuit board 20A. In this case, the pads 22 are provided on the back surface, and each of the pads 22 corresponds to one of the pads 18 of the optical deflector chip 10A. On the other hand, the pads 23 are provided on the front surface, and each of the pads 23 is electrically connected through the plated via-structures 21 to one of the pads 22. The via-structures 21, the pads 23 and the electrode terminals 24 are made of plated Au or Cu. On the other hand, the pads 22 are constructed by a triple structure of Ti (or Cr)/Ni (or Pt)/Au (or Cu) from the double-side printed circuit board 20A by a plating process, a sputtering process and/or an evaporating process. That is, a lower layer made of Ti (or Cr) is in good contact with glass epoxy resin, a barrier metal layer is made of Ni (or Pt), and an upper layer made of Au (or Cu) in accordance with the material of a solder or a bump which is used for bonding the optical deflector chip 10A to the double-side printed circuit board 20A.

A flexible printed circuit (FPC) cable 40 is connected by a thermal contact bonding process to the electrode terminals 24 of the double-side printed circuit board 20A. The flexible printed circuit (FPC) cable 40 is further connected to a control/power supply circuit (not shown) for controlling the optical deflector chip 10A and supplying power thereto.

Figure 2C:
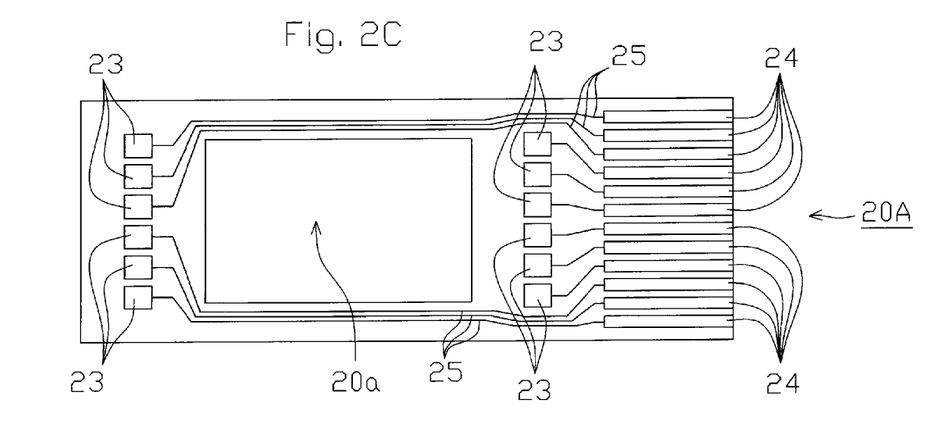
FIG. 2C is a front view of the double-side printed circuit board of FIG. 1.

In FIG. 2C, which is a front view of the double-side printed circuit board 20A of FIG. 1, each of the pads 23 is connected via wiring patterns 25 formed on the front surface to one of the electrode terminals 24 so that the upper electrodes and lower electrodes of the piezoelectric actuators 141, 142, 171 and 172 of the optical deflector chip 10A of FIG. 2B can be connected to the FPC cable 40.

In FIG. 2A, which is a front view of the aluminum substrate 30A of FIG. 1, at least two alignment openings 31 are provided at the aluminum substrate 30A in order to mount the optical deflector apparatus in a projector system.

Figure 3:
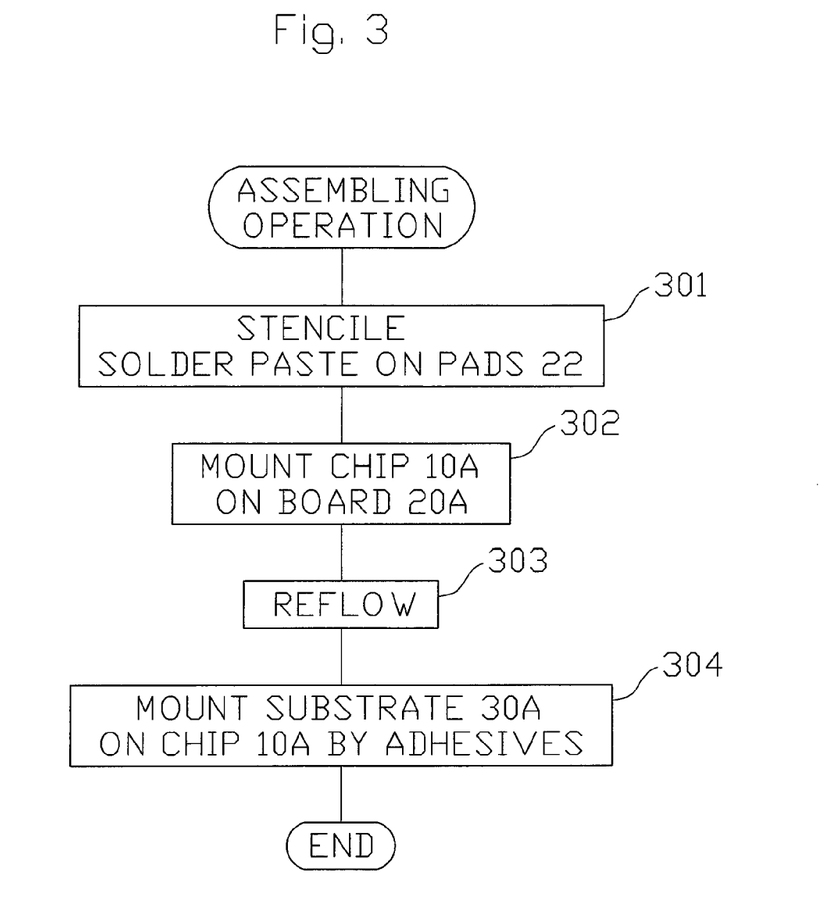
FIGS. 3 and 4 are flowcharts for explaining assembling operations of the optical deflector apparatus of FIG. 1.

An assembling operation of the optical deflector chip 10A, the double-side printed circuit board 20A and the aluminum substrate 30A of FIG. 1 is explained next with reference to FIG. 3.

First, referring to step 301, a Pb-free solder paste or an AuSn eutectic solder paste is stenciled onto the pads 22 of the double-side printed circuit board 20A.

Next, referring to step 302, the optical deflector chip 10A is mounted on the double-side printed circuit board 20A in such a way that the pads 18 of the optical deflector chip 10A are in direct contact with their corresponding pads 22 with the solder paste of the double-side printed circuit board 20A.

Next, referring to step 303, a reflowing process is carried out at a temperature of 260° C. to 310° C. in a reflowing furnace. Thus, the front surface of the optical deflector chip 10A is adhered to the back surface of the double-side printed circuit board 20A.

Finally, referring to step 304, adhesives are coated on either the front surface of the aluminum substrate 30A or the support body 15 of the optical deflector chip 10A. Then, the front surface of the aluminum substrate 30A is mounted on the back surface of the optical deflector chip 10A using the alignment openings 31, so that the front surface of the aluminum substrate 30A is adhered to the back surface, i.e., the support body 15 of the optical deflector chip 10A.

Figure 4:
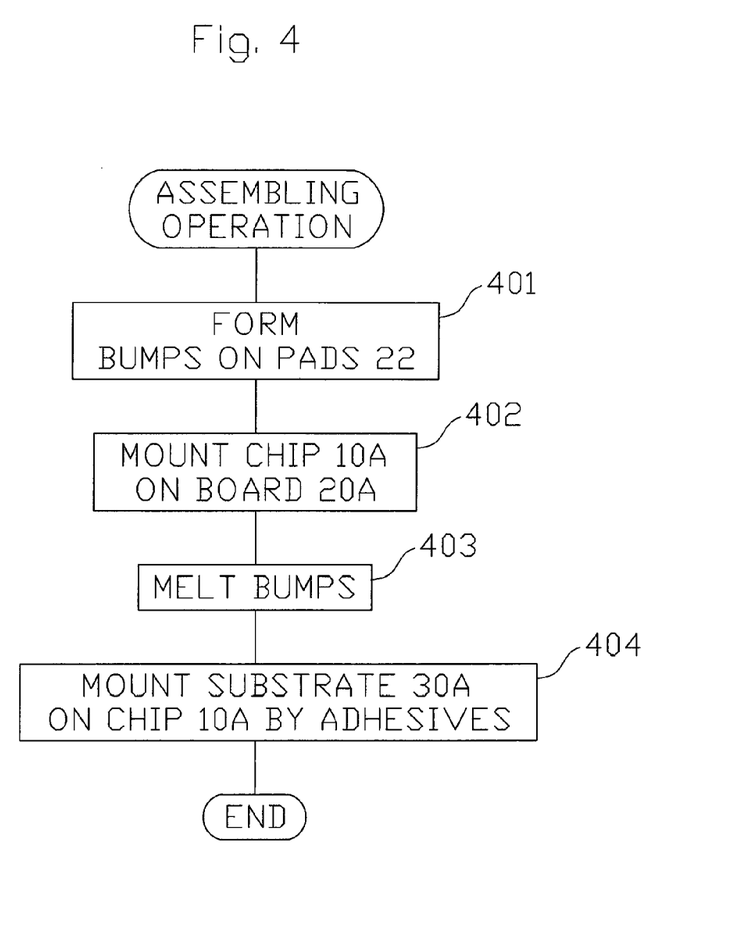

Another assembling operation of the optical deflector chip 10A, the double-side printed circuit board 20A and the aluminum substrate 30A of FIG. 1 is explained next with reference to FIG. 4.

First, referring to step 401, Au bumps are formed on the pads 22 of the double-side printed circuit board 20A.

Next, referring to step 402, the optical deflector chip 10A is mounted on the double-side printed circuit board 20A in such a way that the pads 18 of the optical deflector chip 10A are in direct contact with their corresponding pads 22 with the Au bumps of the double-side printed circuit board 20A.

Next, referring to step 403, an ultrasonic and heating bonding operation is performed upon the Au bumps to melt them. Thus, the front surface of the optical deflector chip 10A is adhered to the back surface of the double-side printed circuit board 20A.

Finally, referring to step 404, adhesives are coated on either the front surface of the aluminum substrate 30A or the support body 15 of the optical deflector chip 10A. Then, the front surface of the aluminum substrate 30A is mounted on the back surface of the optical deflector chip 10A using the alignment openings 31, so that the front surface of the aluminum substrate 30A is adhered to the back surface, i.e., the support body 15 of the optical deflector chip 10A.

Thus, according to the above-described first embodiment, since the size of the double-side printed circuit board 20A and the size of the aluminum substrate 30A in the traverse direction are substantially the same as the optical deflector chip 10A, the optical deflector apparatus of FIG. 1 can be reduced in size. Also, since the double-side printed circuit board 20A and the aluminum substrate 30A without TSVs are both inexpensive, the manufacturing cost can be reduced.

Figure 5:
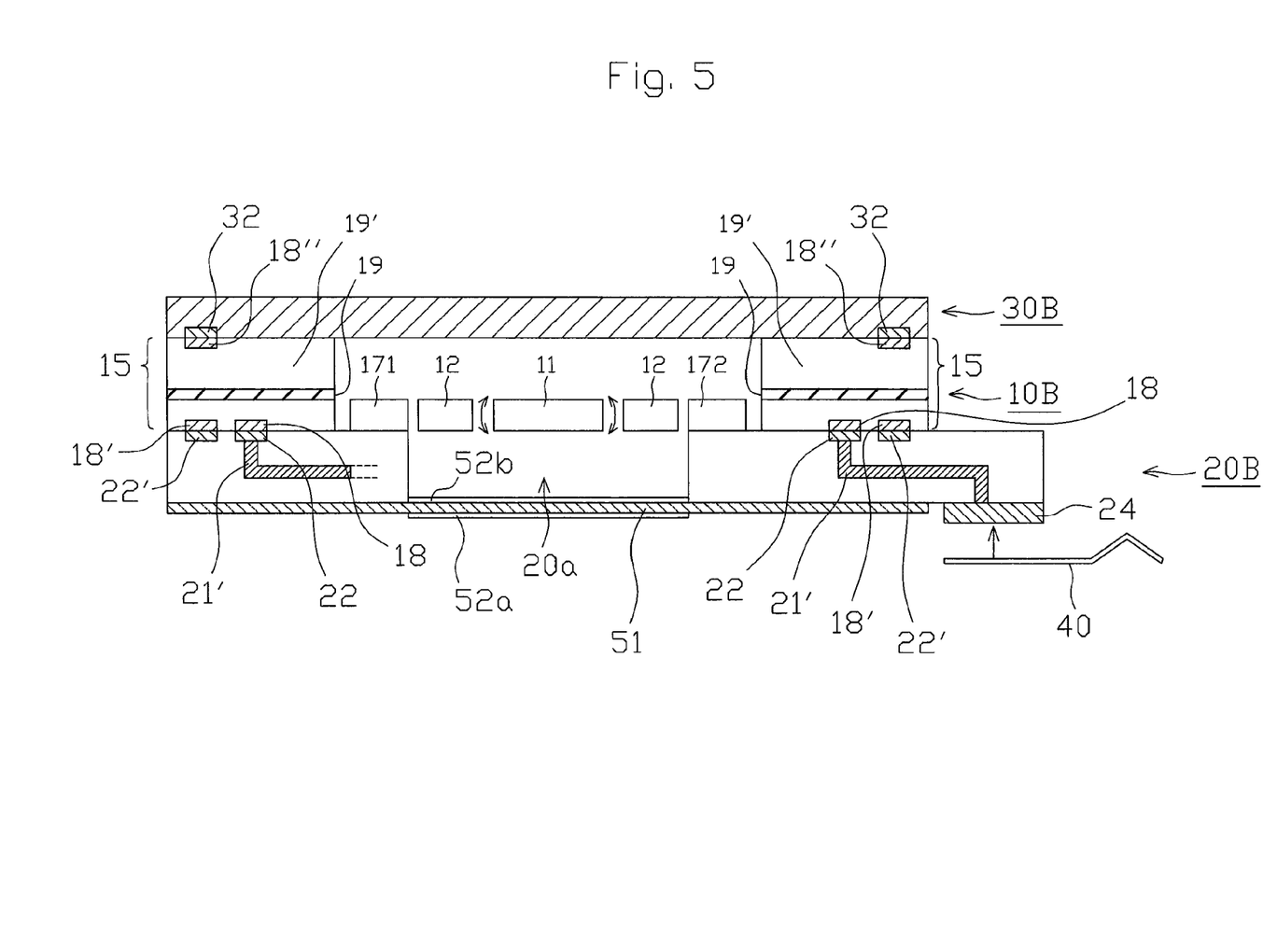
FIG. 5 is a cross-sectional view illustrating a second embodiment of the optical deflector apparatus according to the presently disclosed subject matter.

In FIG. 5, which is a cross-sectional view illustrating a second embodiment of the optical deflector apparatus according to the presently disclosed subject matter, a front surface of an optical deflector chip 10B is adhered by a so-called flip-chip bonding process to a back surface of a double-side printed circuit board 20B as a first substrate made of inorganic material such as low temperature co-fired ceramic (LTCC), while a back surface of the optical deflector chip 10B is adhered to a front surface of a metal substrate such as an aluminum substrate 30B as a second substrate with no circuit. Note that the optical deflector apparatus of FIG. 6 is of a hermetic type where inert gas such as nitrogen gas is introduced to replace the air with it or the inside air is evacuated.

Figure 6A:
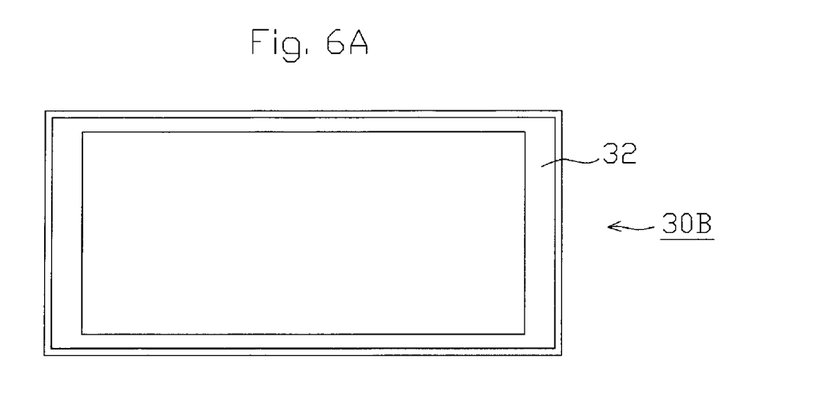
FIG. 6A is a front view of the aluminum substrate of FIG. 5.
Figure 6B:
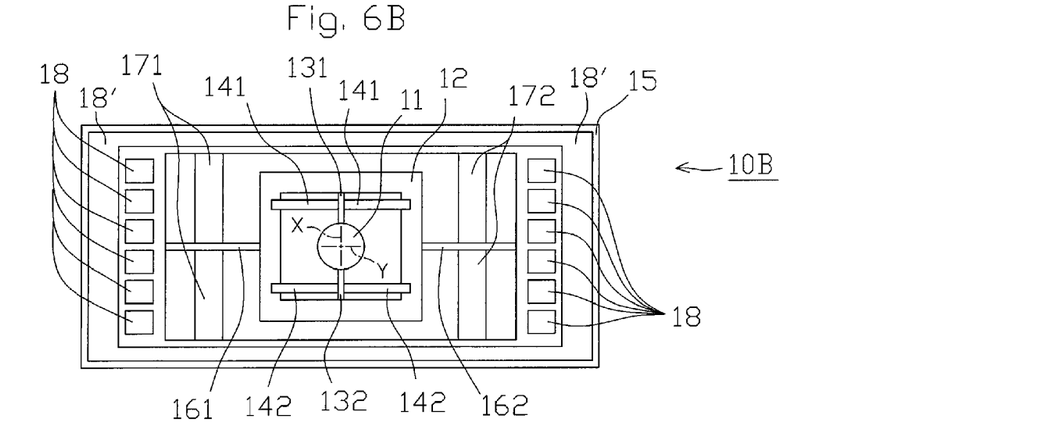
FIG. 6B is a front view of the optical deflector chip of FIG. 5.

In FIG. 5 and FIG. 6B, which is a front view of the optical deflector chip 10B of FIG. 5, the optical deflector chip 10B includes frame-shaped sealing electrode patterns 18' and 18" in addition to the elements of the optical deflector chip 10A of FIGS. 1 and 2B. The materials of the frame-shaped sealing electrode patterns 18' and 18" are the same as those of the pads 18, i.e., plated Au or Cu. The frame-shaped sealing electrode patterns 18' are arranged on the front surface of the optical deflector chip 10B at its periphery, i.e., on the front surface of the support body 15, while the frame-shaped sealing electrode patterns 18" are arranged on the back surface of the optical deflector chip 10B at its periphery, i.e., on the back surface of the support body 15.

Figure 6C:
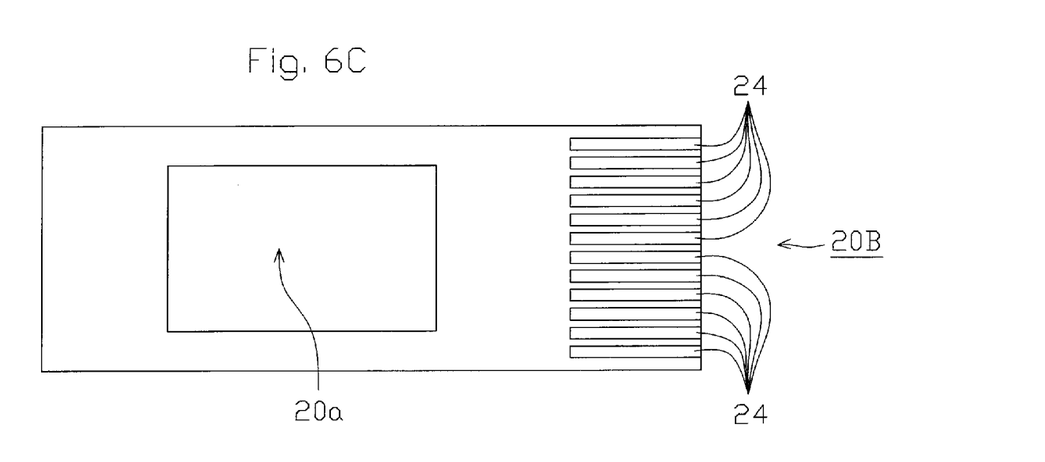
FIG. 6C is a front view of the double-side printed circuit board of FIG. 5.

In FIG. 5 and FIG. 6C, which is a front view of the double-side printed circuit board 20B of FIG. 5, the double-side printed circuit board 20B includes interconnections 21' made of Ag or Cu instead of the plated via-structures 21 of the double-side printed circuit board 20A of FIGS. 1 and 2C. The interconnections 21' connect the pads 22 directly to the electrode terminals 24. Therefore, the pads 23 of FIGS. 1 and 2C are not provided. Note that, if the double-side printed circuit board 20B is made of high temperature co-fired ceramic (HTCC), the interconnections 21' can be made of refractory metal such as W or Ti.

The double-side printed circuit board 20B further includes a frame-shaped sealing electrode pattern 22' corresponding to the frame-shaped sealing electrode patterns 18' of the optical deflector chip 10B. The materials of the frame-shaped sealing electrode pattern 22' are the same as those of the pads 22.

In FIG. 5 and FIG. 6A, which is a front view of the aluminum substrate 30B of FIG. 5, the aluminum substrate 30B includes a frame-shaped sealing electrode pattern 32 corresponding to the frame-shaped sealing electrode patterns 18" of the optical deflector chip 10B. The materials of the frame-shaped sealing electrode pattern 32 are the same as those of the pads 22, and therefore, the frame-shaped sealing electrode pattern 32 is constructed by a triple structure of Ti (or Cr)/Ni (or Pt)/Au (or Cu) from the aluminum substrate 30B by a plating process, a sputtering process and/or an evaporating process.

Also, in FIG. 5, a sealing transparent glass 51 made of borosilicate coated with anti-reflection layers 52a and 52b formed on both sides thereof is provided to seal the opening 20a of the optical deflector apparatus of FIG. 5. In this case, if a light source for generating incident light to the optical deflector apparatus of FIG. 5 is constructed by a red laser diode, a green laser diode and a blue laser diode, each of the anti-reflection layers 52a and 52b is configured to reflect a red light component, a green light component and a blue light component.

Figure 7:
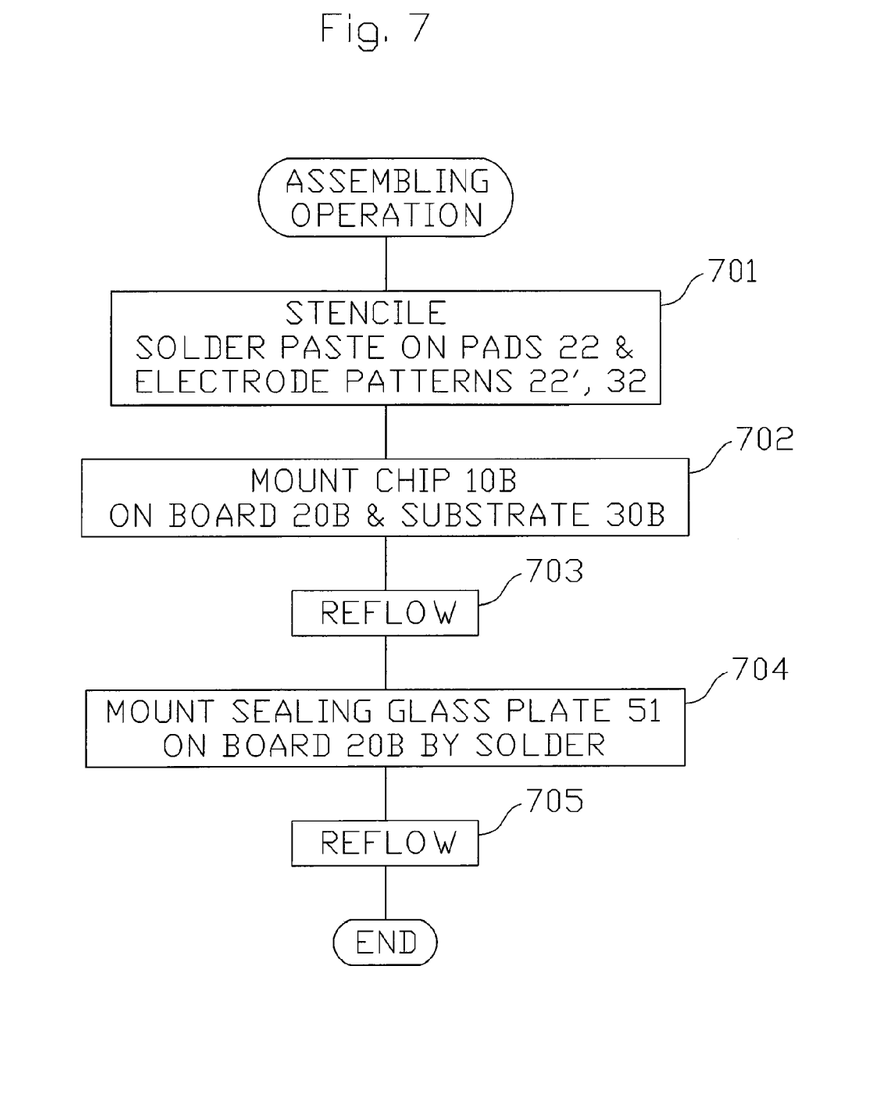
FIG. 7 is flowchart for explaining an assembling operation of the optical deflector apparatus of FIG. 5.

An assembling operation of the optical deflector chip 10B, the double-side printed circuit board 20B and the aluminum substrate 30B of FIG. 5 is explained next with reference to FIG. 7.

First, referring to step 701, a Pb-free solder paste or an AuSn eutectic solder paste is stenciled onto the pads 22 and the frame-shaped sealing electrode pattern 22' of the double-side printed circuit board 20B and the frame-shaped sealing electrode pattern 32 of the aluminum substrate 30B.

Next, referring to step 702, the optical deflector chip 10B is mounted on the double-side printed circuit board 20B in such a way that the pads 18 and the frame-shaped sealing electrode patterns 18' of the optical deflector chip 10B are in direct contact with their corresponding pads 22 and their corresponding frame-shaped sealing electrode pattern 22' with the solder paste of the double-side printed circuit board 20B. Then, the optical deflector chip 10B is mounted on the aluminum substrate 30B in such a way that the frame-shaped sealing electrode patterns 18" of the optical deflector chip 10B are in direct contact with their corresponding electrode pattern 32 with the solder paste of the aluminum substrate 30B.

Next, referring to step 703, a reflowing process is carried out at a temperature of 260° C. to 310° C. in a reflowing furnace. Thus, the front surface of the optical deflector chip 10B is adhered to the back surface of the double-side printed circuit board 20B and the front surface of the aluminum substrate 30B.

Next, referring to step 704, a sealing transparent glass 51 with anti-reflection layers 52a and 52b is mounted on the front surface of the double-side printed circuit board 20B by a soldering process using a Pb-free solder paste in a nitrogen chamber or a vacuum chamber. In the nitrogen chamber, purging operations are carried out several times to exhaust water vapor, carbon dioxide and the like therefrom. On the other hand, in the vacuum chamber, the pressure is about 0.1 to 0.8 atm.

Finally, referring to step 705, a reflowing process is carried out at a temperature of 260° C. in a reflowing furnace. In this case, since the reflowing temperature at step 705 is lower than the reflowing temperature at step 703, the solder paste between the optical deflector chip 10B and the double-side printed circuit board 20B and the solder paste between the optical deflector chip 10B and the aluminum substrate 30B are never remelted. Thus, the front surface of the sealing transparent glass 51 is surely adhered to the front surface of the double-side printed circuit board 20B.

In the above-described second embodiment, alignment openings 32 can be provided in the corners of the aluminum substrate 30B in the same way as in the first embodiment.

Thus, according to the above-described second embodiment, since the size of the double-side printed circuit board 20B and the size of the aluminum substrate 30B in the traverse direction are substantially the same as the optical deflector chip 10B, the optical deflector apparatus of FIG. 5 can be reduced in size. Also, the hermetic optical deflector apparatus can easily be realized without increasing the manufacturing cost.

Figure 8:
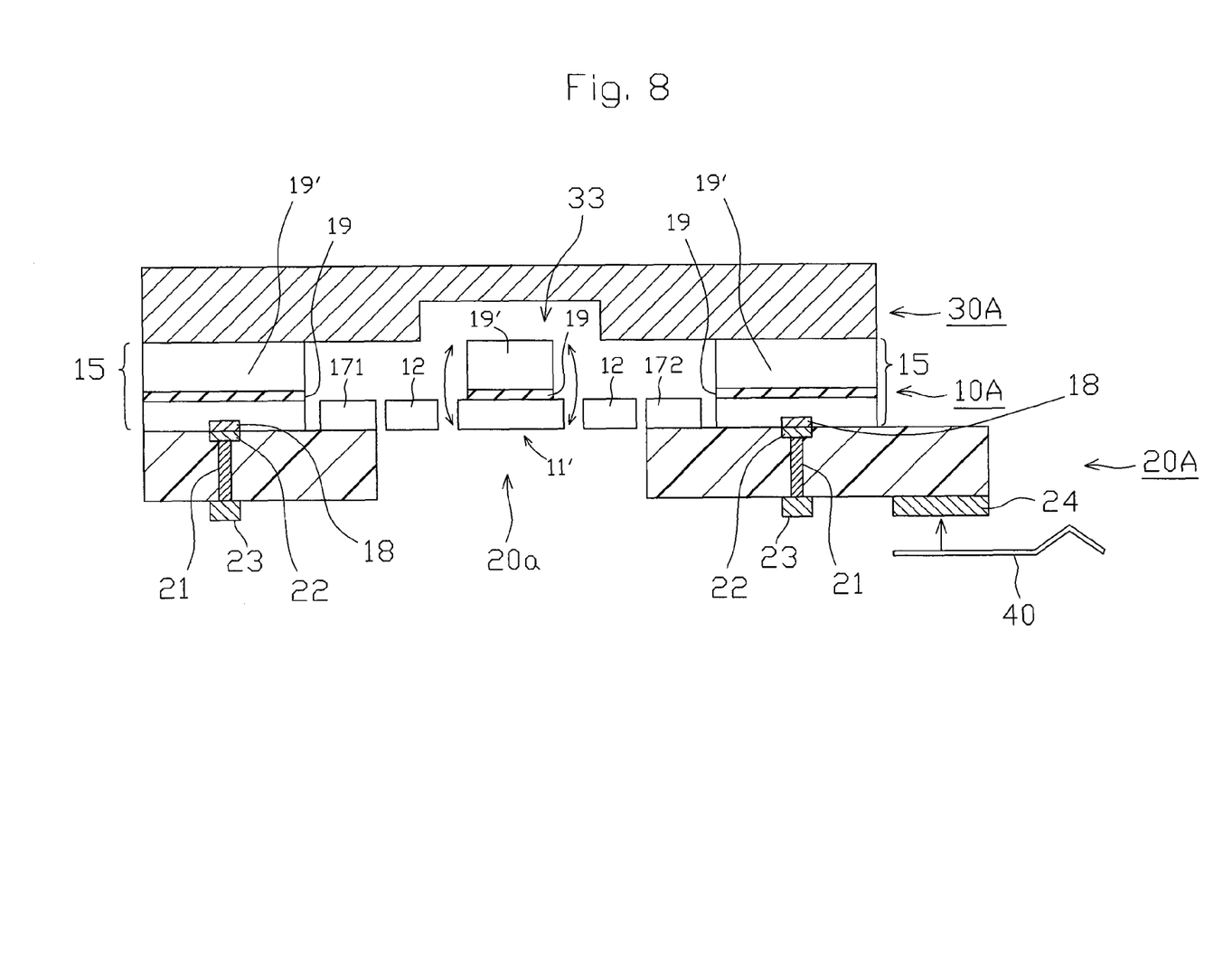
FIGS. 8 and 9 are cross-sectional views illustrating modifications of the optical deflector apparatus of FIGS. 1 and 5, respectively.

In FIG. 8, which is a modification of the optical deflector apparatus of FIG. 1, a mirror 11' is of a rib structure whose thickness is, in this case, the same as the support body 15, and also, a recess 33 opposing the rib structure of the mirror 11' is formed in the aluminum substrate 30A. Therefore, when the mirror 11' with the rib structure is rocked, the mirror 11' with the rib structure never collides with the aluminum substrate 30A. Note that the size of the recess 33 in the traverse direction is smaller than the size of the opening 20a of the double-side printed circuit board 20B in the traverse direction.

The rib structure of the mirror 11' is operated to effectively suppress the dynamic deformation of the mirror 11' when the mirror 11' is rocking.

Since the substrate 30A is made of metal such as aluminum, the recess 33 can easily be formed by a cutting process or the like.

Figure 9:
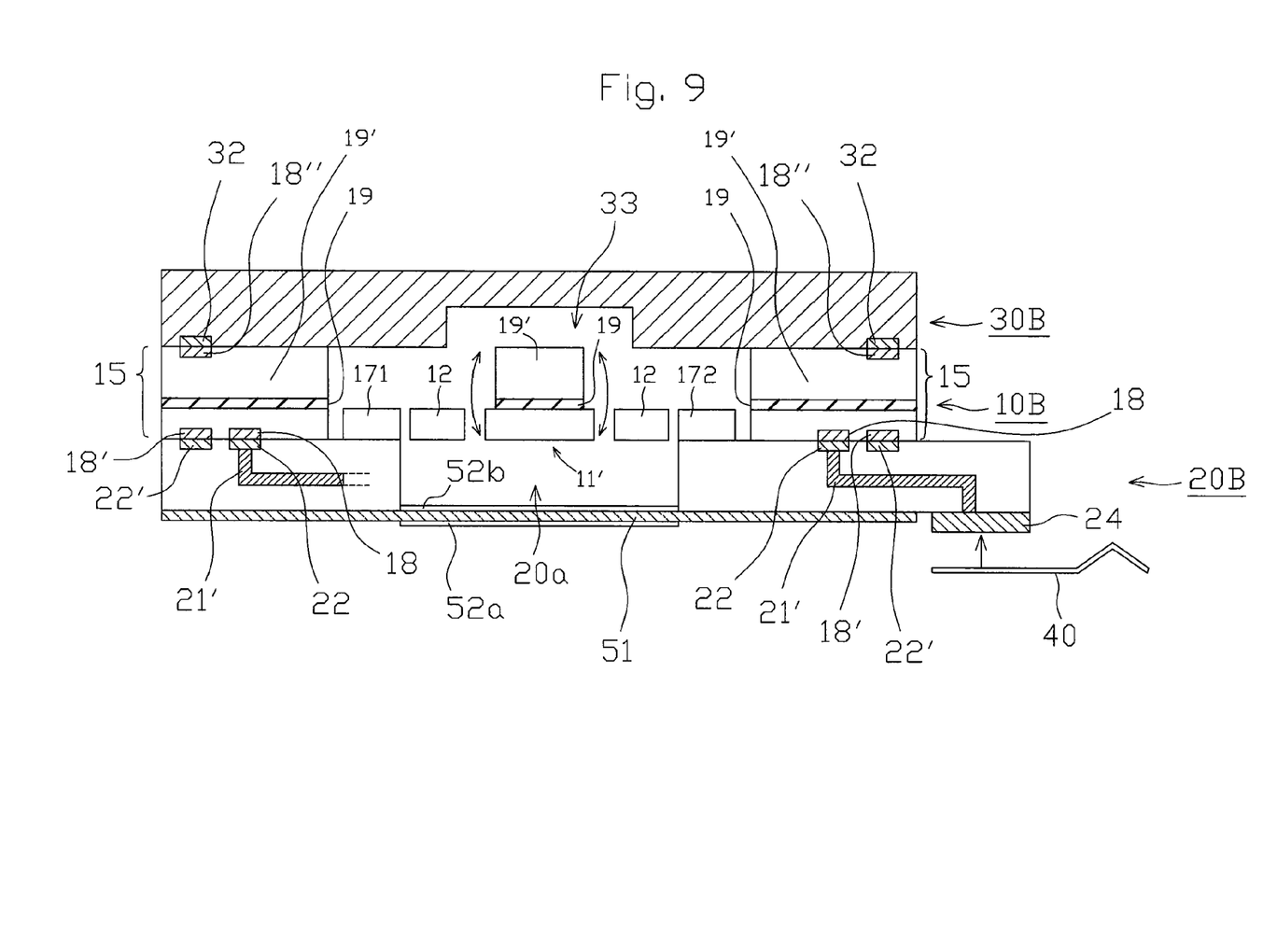

In FIG. 9, which is a modification of the optical deflector apparatus of FIG. 5, in the same way as in FIG. 8, a mirror 11' is of a rib structure whose thickness is, in this case, the same as the support body 15, and also, a recess 33 opposing the rib structure of the mirror 11' is formed in the aluminum substrate 30B. Therefore, when the mirror 11' with the rib structure is rocked, the mirror 11' with the rib structure never collides with the aluminum substrate 30B.

In the above-described embodiments, the optical deflector chip constitutes a two-dimensional optical deflector where the inner and outer actuators are both torsion-bar type piezoelectric actuators; however, the presently disclosed subject matter can be applied to other two-dimensional optical deflectors. Also, the presently disclosed subject matter can be applied to a one-dimensional optical deflector. Further, the presently disclosed subject matter can be applied to a comb-shaped type electrostatic actuator.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. An optical deflector apparatus comprising:
   an optical deflector chip including a mirror, an actuator adapted to rock said mirror, and first pads on a front surface of said optical deflector chip and connected to said actuator;
   a first substrate including second pads on a back surface of said first substrate, an opening being formed in said first substrate; and
   a second substrate,
   said front surface of said optical deflector chip being adhered to said back surface of said first substrate in such a way that said first pads of said optical deflector chip are in contact with respective ones of said second pads of said first substrate and said mirror opposes said opening,
   a back surface of said optical deflector chip being adhered to a front surface of said second substrate.

2. The optical deflector apparatus as set forth in claim 1, wherein said first substrate comprises organic material.

3. The optical deflector apparatus as set forth in claim 2, wherein said organic material is glass epoxy resin.

4. The optical deflector apparatus as set forth in claim 2, wherein said first substrate further includes:
   third pads on a front surface of said first substrate;
   via-structures in said first substrate connected between said first pads and said third pads; and
   electrode terminals on said front surface of said first substrate and being connected to respective ones of said third pads.

5. The optical deflector apparatus as set forth in claim 2, wherein adhesion between said front surface of said optical deflector chip and said back surface of first substrate is carried out by stenciling solder paste onto said second pads of said first substrate.

6. The optical deflector apparatus as set forth in claim 2, wherein adhesion between said front surface of said optical deflector chip and said back surface of first substrate is carried out by mounting bumps onto said second pads of said first substrate.

7. The optical deflector apparatus as set forth in claim 1, wherein said first substrate comprises ceramic.

8. The optical deflector apparatus as set forth in claim 7, wherein said first substrate further includes:

electrode terminals on a front surface of said first substrate; and interconnections in said first substrate connected between said second pads and respective ones of said electrode terminals.

9. The optical deflector apparatus as set forth in claim 8, wherein said optical deflector chip further includes:
a first frame-shaped sealing electrode pattern on said front surface of said optical deflector chip; and
a second frame-shaped sealing electrode pattern on said back surface of said optical deflector chip,
said first substrate further including a third frame-shaped electrode pattern on said back surface of said first substrate in contact with said first frame-shaped electrode pattern of said optical deflector chip,
said second substrate further including a fourth frame-shaped electrode pattern on said front surface of said second substrate in contact with said second frame-shaped electrode pattern of said optical deflector chip,
said optical deflector apparatus further comprising a sealing transparent glass plate adhered to said front surface of said first substrate to seal said opening.

10. The optical deflector apparatus as set forth in claim 9, wherein inert gas is introduced.

11. The optical deflector apparatus as set forth in claim 9, wherein a vacuum is drawn.

12. The optical deflector apparatus as set forth in claim 9, further comprising anti-reflection layers formed on both surfaces of said sealing transparent glass plate.

13. The optical deflector apparatus as set forth in claim 12, wherein each of said anti-reflection layers are configured to reflect a red light component, a green light component and a blue light component.

14. The optical deflector apparatus as set forth in claim 1, wherein said mirror is of a rib structure, and a recess opposing said rib structure is formed in said second substrate.

15. The optical deflector apparatus as set forth in claim 1, wherein said second substrate comprises metal.

16. The optical deflector apparatus as set forth in claim 15, wherein said metal comprises aluminum.

* * * * *